United States Patent [19]

Mitama

[11] 4,392,245
[45] Jul. 5, 1983

[54] RADIO TRANSMITTER HAVING AN OUTPUT POWER CONTROL CIRCUIT

[75] Inventor: Masataka Mitama, Tokyo, Japan

[73] Assignee: Nippon Electric Co., Ltd., Tokyo, Japan

[21] Appl. No.: 218,477

[22] Filed: Dec. 22, 1980

[30] Foreign Application Priority Data

Jan. 10, 1980 [JP] Japan .................... 55-1542[U]

[51] Int. Cl.³ .......................................... H04B 7/005
[52] U.S. Cl. ...................... 455/115; 455/116; 455/117; 330/207 R
[58] Field of Search .............. 455/115, 117, 116, 126, 455/73, 54, 56, 67; 332/38; 333/17 R, 17 L, 81 R; 307/540; 330/207 P, 298

[56] References Cited

U.S. PATENT DOCUMENTS

| | | | |
|---|---|---|---|
| 3,641,451 | 2/1972 | Hollingsworth | 330/298 |
| 3,662,290 | 5/1972 | Elliott | 332/38 |
| 3,715,690 | 2/1973 | Young | 333/17 |
| 3,866,136 | 2/1975 | Augustin | 330/298 |
| 4,013,961 | 3/1977 | Colebourn | 455/115 |
| 4,044,308 | 8/1977 | Stites | 455/116 |
| 4,165,493 | 8/1979 | Harrington | 455/115 |

OTHER PUBLICATIONS

Tait Electronics Ltd. Service Manual "T 196 Miniphone", UHF Frequency Modulated Radio Telephone.

*Primary Examiner*—Tommy P. Chin
*Attorney, Agent, or Firm*—Laff, Whitesel, Conte & Saret

[57] ABSTRACT

A radio transmitter has an output power control circuit including a power amplifier, a directional coupler coupled to the power amplifier, a detector of the forward power of the directional coupler, a generator of a difference voltage between the output voltage of the detector means and a reference voltage. A power regulator varys the output power of the power amplifier in response to the output of the difference voltage. The power applied from the power amplifier through the directional coupler to the detector is controlled by a control signal.

The control circuit electrically varies the coupling coefficient of the directional coupler for attenuating the power applied from the directional coupler to the detector means to extend the controllable range of the transmitter output power.

10 Claims, 4 Drawing Figures

RADIO TRANSMITTER HAVING AN OUTPUT POWER CONTROL CIRCUIT

The present invention relates to radio transmitters, and more particularly, a circuit for controlling the output power for a radio transmitter.

In a radio communication system, such as a mobile communication system where the communication distance between a base station and a mobile unit greatly varies from moment to moment, it is necessary to control the transmitter output power so that the radio signal intensity at the base station lies within a prescribed level.

A conventional transmitter output power control circuit (for example, T 196 miniphone marketed by TAIT ELECTRONICS LTD.) comprises a power amplifier, a coupler coupled to the output of the power amplifier, a detector to detect the forward power of the directional coupler, means to provide a difference voltage between the DC output voltage of the detector and a reference voltage, and a power regulator means to regulate the output power of the power amplifier in response to the difference voltage.

In such a control circuit, the transmitter output power is changed by varying the reference voltage in response to control signals. This reference voltage may be varied extensively, but the minimum power detectable by the detector diode used in the detector is about several mW (milli watt), while the allowable maximum input power is about several hundred mW. Accordingly, if the coupling coefficient of the directional coupler is fixed, the range of variation for the detectable output power is about 20 dB or less. Thus, the conventional control circuit has a narrow range in which the transmitter output power is controllable.

An object of the present invention is, therefore, to provide a transmitter power control circuit for a transmitter which has wide controllable range for the transmitter output power.

According to the present invention, a radio transmitter has an output power control circuit comprising a power amplifier, a directional coupler coupled to the power amplifier, a detector means for detecting the forward power of the directional coupler, a generator means for generating the difference voltage between the output voltage of the detector means and a reference voltage. A power regulator means varies the output power of the power amplifier in response to the output of the generator means. A first means is responsive to a control signal for varying the power applied from the power amplifier to the detector means by way of the directional coupler.

The features of the present invention lie in that the control circuit includes the first means. The first means electrically varies the coupling coefficient of the directional coupler or attenuates the power applied from the directional coupler to the detector means. The power applied to the detector diode is appropriately changed, thereby extending the controllable range of the transmitter output power.

The object and features of present invention will be described in detail hereinafter by referring to the accompanying drawings wherein.

Figures 1, 2:
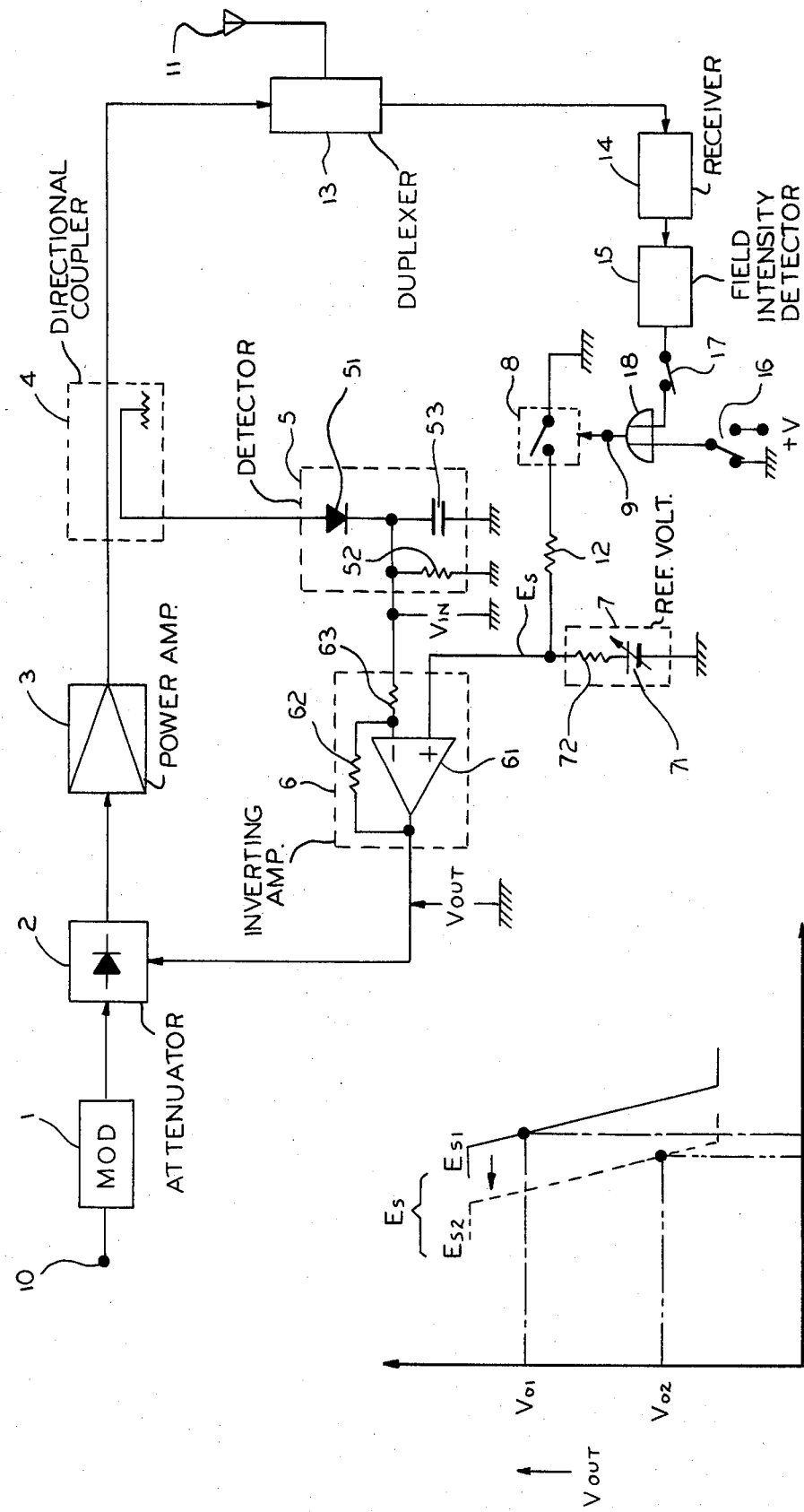
FIG. 1 is a block diagram showing an example of a conventional transmitter power control circuit.
FIG. 2 shows the input/output characteristics of a differential amplifier, to explain the operation of FIG. 1.

FIG. 1 begins with a description of an operation when a switch 8 is opened. At a modulator 1, a carrier wave is modulated by the signals supplied to a terminal 10. The modulated signal is then supplied to a power amplifier 3 via a PIN diode variable attenuator 2 (or a power regulator). The output (or forward power) of the power amplifier 3 is applied to antenna 11 via a directional coupler 4 and a duplexer 13. A portion of this output is detected by a detector 5 (comprising a detector diode 51, a resistor 52 and a capacitor 53). The detector 5 provides a voltage $V_{in}$ which is applied to the inverting input terminal of an inverting amplifier 6 (comprising a differential amplifier 61 and resistors 62, 63). The output voltage $V_{out}$ of the amplifier 6 changes in response to changes of the voltage $V_{in}$ as shown by the solid line in FIG. 2.

In FIGS. 1 and 2 a voltage $E_s$ is applied to the non-inverting input terminal of the amplifer 6 and is given by a reference voltage generator 7 (comprising a DC power source 71 and a resistor 72). The voltage $V_{out}$ is applied to the PIN diode variable attenuator 2, to change the input power to the power amplifier 3 and, consequently, its output power as well. The control loop extending from the power amplifier 3 to the PIN diode variable attenuator 2 via the directional coupler 4, the detector 5 and the amplifier 6 forms a negative feedback loop. Voltage $E_s$ is adjusted to obtain the voltage $V_{out}$ corresponding to a predetermined $V_{in}$, or to a predetermined transmitter output power. In FIG. 2, these voltages $E_s$, $V_{out}$, $V_{in}$ are denoted as $V_{11}$, $E_{s1}$ and $V_{01}$, respectively. By the above-mentioned negative feedback operation, the output power level is maintained at a level corresponding to $E_{s1}$.

When the switch 8 is next closed in response to the high level control signal applied to the terminal 9, the power source voltage is divided by the resistors 72 and 12, $E_{s1}$ becomes $E_{s2}$ ($E_{s2} < E_{s1}$). The transmitter output power level is lowered depending on $E_{s2}$. The operating point of the operational amplifier is the point ($V_{12}$, $V_{02}$) shown in FIG. 2.

In the mobile communication system, the control signal is automatically supplied to the terminal 9, from an electric field intensity detector 15 (comprising an amplifier, a rectifier and a level comparator, for example) via a switch 17 and an OR gate 18. The detector 15 detects whether or not the electric field intensity of a modulated carrier wave from the base station exceeds a predetermined value, or whether or not the mobile unit approaches the base station within a predetermined range. Responsive to these detected conditions, circuit 15 provides high or low level control signal.

Also, the control signal may be manually supplied to the terminal 9 from a manual switch 16, via the OR gate 18. In the manual operation, the switch 17 is opened. On the other hand, in the automatic operation, the switches 16 and 17 are respectively set in the states shown in FIG. 1. Reference numeral 14 denotes a receiver section which receives and demodulates the modulated carrier wave transmitted from the base station via the antenna 11 and the duplexer 13.

In the conventional transmitter output power control circuit mentioned above, the coupling coefficient of the directional coupler is fixed. Also, the detector diode 51 has the upper and the lower limits for detection of the power. Accordingly, if the coupling coefficient of the directional coupler is set at a large value, the lower limit of the controllable transmitter output power becomes higher, but it is not possible to lower the upper limit of the transmitter output power. On the other hand, if the coupling coefficient of the directional coupler is set at a small value, the upper limit becomes higher, but it is impossible to lower the lower limit.

Figure 3:
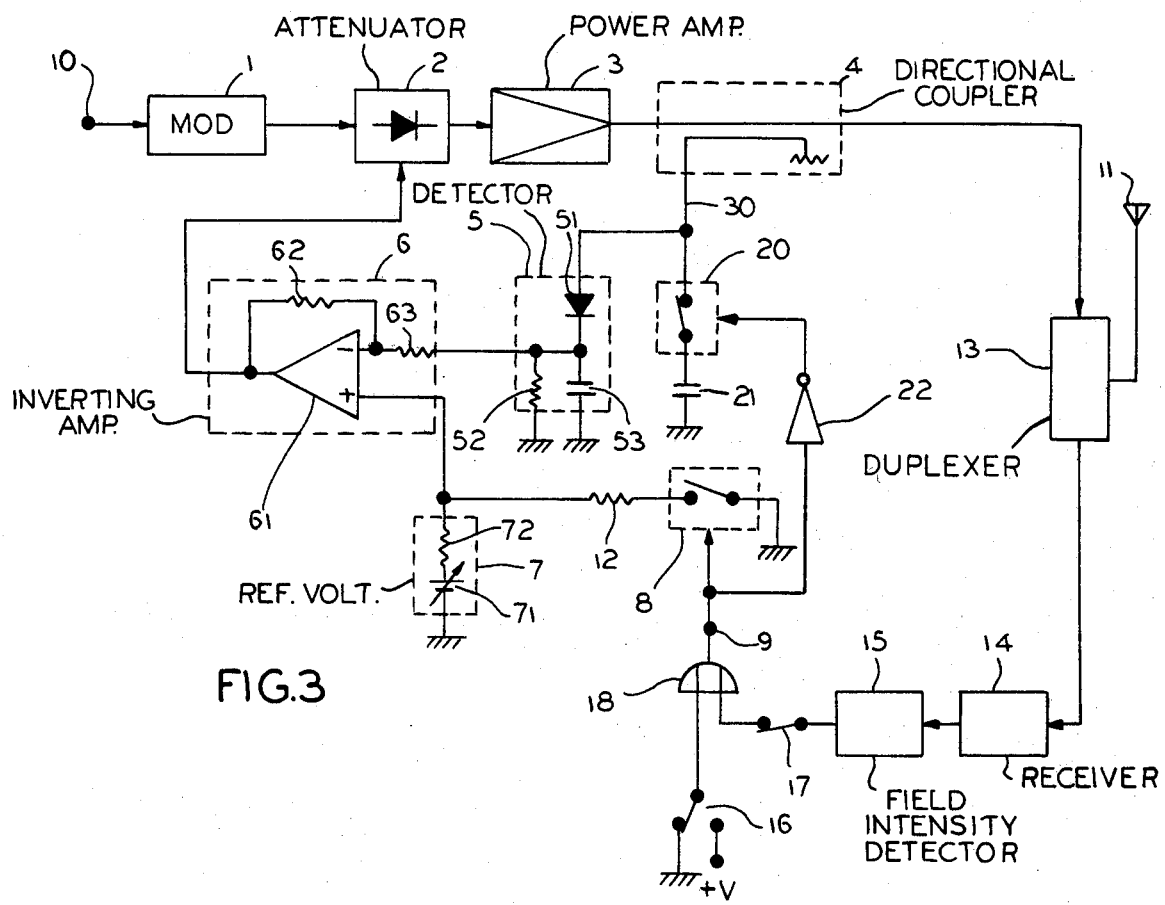
FIG. 3 is a block diagram showing an embodiment of an output power control circuit for a transmitter, in accordance with the present invention.

FIG. 3 shows the transmitter output power control circuit according to the present invention. The same reference numerals, as those shown in FIG. 1, denote the same functions. A feature of the control circuit shown in FIG. 3 lies in a capacitor 21 which is coupled to a coupling port 30 of the directional coupler 4 via a switch 20. The switch 20 is connected to a control signal terminal 9 via an inverter circuit 22. Accordingly, when the switch 8 is open, the switch 20 is closed. Thus, the two switches are opened and closed in a complementary relationship to each other. The coupling coefficient of the directional coupler 4 is set at a value larger than that of FIG. 1. For instance, it is set at a value larger by 10 dB to facilitate explanation.

When the switch 8 is open and the switch 20 is closed, the coupling port 30 and the capacitor 21 are connected. The total coupling coefficient $\beta_T$ then is given by, the following formula:

$$\beta_T = \beta_o / \{1 + (\pi C Z_o f)^2\}$$

wherein: $\beta_o$ denotes the coupling coefficient of the directional coupler 4;

C, the capacitance of the capacitor 21;

$Z_0$, the characteristic impedance of the coupling port transmission line of the directional coupler 4; and f, the transmission signal frequency.

When f=900 MHz, $Z_o$=50Ω, and C=21 pF, the total coupling coefficient $\beta_T$ is about $\beta_o/10$, and, accordingly equals the coupling coefficient of the coupler 4 in FIG. 1. In other words, the upper limit of the controllable power level becomes the same as in FIG. 1.

On the other hand, when the switch 8 is closed and the switch 20 is open, $\beta_T = \beta_o$. The coupling coefficient is larger than that of FIG. 1 by 10 dB, and accordingly, the lower limit of the controllable output level can be lowered by 10 dB as compared to that in FIG. 1. In other words, a variation can be accomplished in the coupling coefficient of the directional coupler 4 by using the capacitor 21, which results in an extensive variation in the transmitter output power. In the preceding description, one switch 20 controls one capacitor 21 in response to a control signal to change the coupling coefficient of the coupler 4. However, a plurality of switches may control a plurality of capacitors in response to a plurality of control signals.

Figure 4:
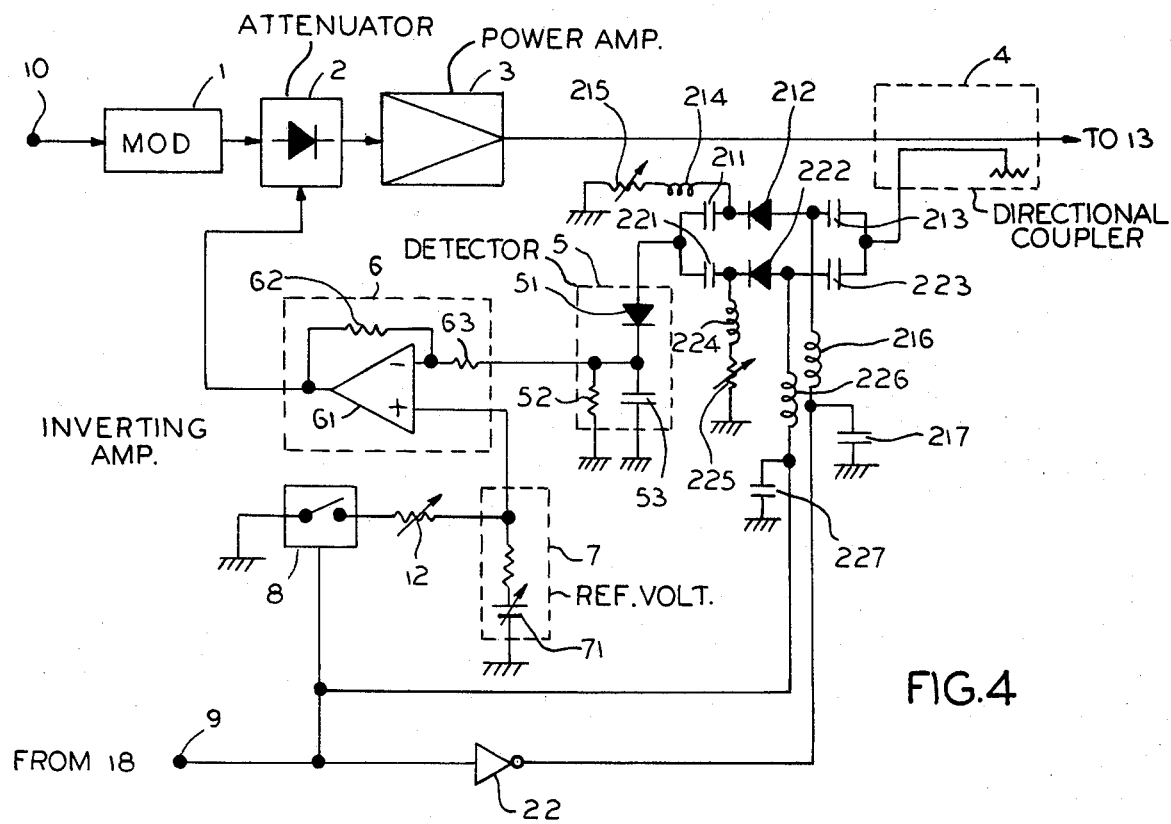
FIG. 4 is a block diagram showing another embodiment of a transmitter output power control circuit, in accordance with the present invention.

FIG. 4 shows another embodiment of the transmitter power control circuit according to the present invention. The same reference numerals, as those shown in FIGS. 1 and 3, denote the same functions. A feature of the control circuit shown in FIG. 4 is that a PIN diode attenuator is provided between the directional coupler 4 with a fixed coupling coefficient and the detector 5. When the switch 8 is opened in response to the control signal applied to the terminal 9, PIN diodes 212 and 222 switch ON and OFF, respectively because inverter 22 reverses polarity to one of the PIN diodes. When the switch 8 is closed, the PIN diodes 212 and 222 switch OFF and ON, respectively. The coupling coefficient of the directional coupler 4 is set at a value which is larger by 10 dB than the corresponding value which is normally used in the circuit of FIG. 1. The variable resistor 215 is adjusted, in advance, to set the attenuation by the PIN diode 212 at 10 dB. Similarly, the attenuation at the PIN diode 222 is set at the smallest possible value (usually about 2 dB), by adjusting the variable resistor 225. It will be clear, then, that the controllable limits of the output power can be extensively changed, in a manner which is similar to that described in respect of the embodiment shown in FIG. 3.

The reference numerals 211, 221, 213 and 223 denote DC blocking capacitors; 217 and 227, RF by-passing capacitors; and 214, 224, 216 and 226, RF blocking choke coils.

As described heretofore, the transmitter power control circuit in accordance with the present invention enables extension of the range of controllable output power level.

What I claim is:

1. A radio transmitter having a forward power output control circuit comprising power amplifier means, directional coupler means coupled to said power amplifier means, detector means for detecting the forward power output of said directional coupler means, generator means for generating a difference voltage responsive to a difference between an output voltage of said detector means and a reference voltage, power regulator means for varying the output power for said power amplifier means in response to the output of said generator means, and first means between said directional coupler means and said detector means for varying the power applied from said power amplifier means via said directional coupler to said detector means in response to a control signal, thereby extending a controllable range for output power of said radio transmitter.

2. A radio transmitter having the forward power output control circuit claimed in claim 1 wherein said directional coupler means has a coupling point, a potential point, said first means comprises a second means coupled between said coupling point and said potential point for electrically varying a coupling coefficient of said directional coupler.

3. A radio transmitter having the forward power output control circuit as claimed in claim 2 wherein said second means comprises a capacitor capable of being coupled between said coupling point and said potential point, and means responsive to said control signal for coupling therethrough said capacitor to said coupling point.

4. A radio transmitter having the forward power output control circuit as claimed in claim 1 wherein said first means comprises a second means coupled between said directional coupler means and said detector means for attenuating the power applied from said directional coupler means to said detector means.

5. A radio transmitter having the forward power output control circuit as claimed in claim 1, further comprising means for receiving signals from another radio transmitter, and means for detecting the electric field intensity of the receiving signals to provide said control signal.

6. An output power control circuit for use in a radio system having at least two stations, one of said stations having a variable broadcast signal power requirement, said circuit comprising first means at one of said stations for transmitting signals to and receiving signals from another of said stations, second means having a power amplifier means and directional coupler means coupled to said power amplifier means for feeding outgoing signals to said first means, detector means for detecting the power of said outgoing signals fed to said first means, means for comparing said detected power with a reference signal, and third means coupled to said power amplifier means responsive to an output of said comparing means for controlling the power of said outgoing signal applied to said direction coupler means, said second means including fourth means responsive to a control signal for varying the power fed from said directional coupler means to said detector means, thereby extending a controllable range of the power transmitted from said one of said stations.

7. The circuit of claim 6, further comprising means responsive to signals received from said other station for detecting the intensity of the electrical field broadcast from said other station, and means responsive to said detected field intensity for providing said control signal.

8. The circuit of claim 7 further comprising means for manually overriding the means for controlling the power of said outgoing signal.

9. The circuit of claim 7 wherein said radio system is a mobile communication system, said one station is a base station and said other station is a mobile station, whereby said circuit varies power transmitted from said base station to said mobile station in response to said control signal as a function of the distance between said mobile and said base stations as indicated by the strength of a mobile station signal as received at said base station.

10. The circuit of claim 7, further comprising means responsive to said control signal for varying the level of said reference signal.

* * * * *